United States Patent [19]

Yu et al.

[11] Patent Number: 5,027,357

[45] Date of Patent: Jun. 25, 1991

[54] ECC/CRC ERROR DETECTION AND CORRECTION SYSTEM

[75] Inventors: Chung-Li Yu, San Jose; Edward T. Pak, Fremont; Ho-Ming Leung, San Francisco, all of Calif.

[73] Assignee: Advanced Micro Devices, Inc., Sunnyvale, Calif.

[21] Appl. No.: 258,240

[22] Filed: Oct. 14, 1988

[51] Int. Cl.$^5$ ............................................. G11B 20/18
[52] U.S. Cl. .................................. 371/37.7; 371/37.4
[58] Field of Search ..................... 371/37.1, 37.4, 37.5, 371/37.7, 40.1; 369/53; 360/53

[56] References Cited

U.S. PATENT DOCUMENTS 4,750,178 6/1988 Sako et al. ..................... 371/37.4

OTHER PUBLICATIONS

Shao, H. et al., "A VLSI Design of a Pipeline Reed-Solomon Decoder", IEEE Trans. on Computers, May 1985, pp. 393–403.

Adaptec Programmable Storage Controller AIC-01-0F-10..., preliminary data sheets, Aug. 1986, pp. 1–13, 16–32.

Chien, R., "Cyclic Decoding Procedures for Bose-Chaudhuri-Hocquenghem Codes", IEEE Trans. on Information Theory, Oct. 1964, pp. 357–363.

Primary Examiner—Stephen M. Baker

[57] ABSTRACT

Occurrence of uncorrectable errors in a stored sector of data which includes a data block, an error checking and correcting (ECC) block and an error detecting (CRC) block is detected. ECC logic is connected to a data bus and responsive to the ECC block in the sector, for generating an error polynomial identifying a location and a value for correctable errors in the sector. CRC logic is connected to the data bus and responsive to the CRC block in the sector for generating a syndrome identifying detected errors in the data block. An evaluation logic circuit is included that is coupled to the ECC logic and the CRC logic and responsive to the error polynomial and the syndrome for generating an uncorrectable error signal if the detected errors do not match the correctable errors. The error checking and correcting code is a Reed-Solomon code as in the X3B11 standard. Likewise the CRC code is a Reed-Solomon code as in the X3B11 standard. The evaluation logic implements a reverse CRC generation polynomial having a plurality of terms in the same order as the error polynomial. Detection logic receives the plurality of terms of the error polynomial, generates an estimated CRC syndrome based on the reverse CRC generation polynomial, and generates the uncorrectable error signal if the estimated CRC syndrome is not equal to the generated CRC syndrome.

25 Claims, 3 Drawing Sheets

ECC/CRC ERROR DETECTION AND CORRECTION SYSTEM

BACKGROUND OF THE INVENTION

1. Field of the Invention

The present invention relates to error detection and correction systems employing a first code for detection and correction of errors, and a second code for detecting errors by which the presence of uncorrectable errors is determined.

2. Description of Related Art

A standard encoding specification for 5¼ inch optical storage devices known as X3B11 has been adopted by the data storage systems industry. According to this standard, data is stored in sectors which consist of three or more interleaves of data. A data field error checking and correcting (ECC) code is generated over each interleave and a data field cyclic redundancy code (CRC) is generated over the XOR sum of data bytes across the interleaves, i.e. to the XOR sum of all data bytes with the same displacement from the beginning of each interleave.

The ECC code is utilized to locate and correct correctable errors in each sector. The CRC code is utilized to determine whether errors exist in the sector that may not have been identified and corrected using the ECC code. When such errors are identified, then an uncorrectable sector signal is generated.

Although this X3B11 specification has been implemented for optical disk systems, it is particularly useful for any data storage system characterized by frequent burst errors.

Performance of data storage systems using the ECC/CRC codes for identifying uncorrectable errors is limited by the time required to compare the errors located and corrected by the ECC with those detected by the CRC code. A typical system using the X3B11 standard is required first to read the data of a sector, and then to generate a syndrome based on the ECC code. From the syndrome, error location and error value polynomials are generated and the data is corrected. The corrected data is then read for generation of a CRC syndrome. If the generation of the CRC syndrome based on the corrected data is non-zero, then an uncorrectable error is detected. This algorithm is obviously burdensome in that it requires reading of the entire sector of data twice.

It would be desirable to utilize the two code error checking and correcting systems, such as the X3B11 standard, without requiring two reads of the sector of data involved in the correction, and otherwise improve the performance of error detection and correction systems.

SUMMARY OF THE INVENTION

The present invention provides an apparatus for signalling the occurrence of uncorrectable errors in a stored sector of data which includes a data block, an error detecting (CRC) block, and an error checking and correcting (ECC) block. The apparatus includes a data bus which is connected to a storage system for communication of the sector of data. CRC logic is connected to the data bus and responsive to the CRC block in the sector for generating a syndrome identifying detected errors in the data block. ECC logic is connected to the data bus and responsive to the ECC block in the sector, for generating an error polynomial identifying a location and a value for correctable errors in the sector. An evaluation logic circuit is included that is coupled to the ECC logic and the CRC logic and responsive to the error polynomial and the syndrome for generating an uncorrectable error signal if the detected errors do not match the correctable errors.

According to one aspect, the ECC code is a Reed-Solomon code as in the X3B11 standard. Likewise the CRC code is a Reed-Solomon code as in the X3B11 standard. The ECC logic generates the plurality of terms in the error polynomial in an order with respect to the bytes of data in the data block. The CRC syndrome is a second polynomial with a plurality of terms generated in response to a CRC generation polynomial. The evaluation logic implements a reverse CRC generation polynomial. Detection logic receives the plurality of terms of the error polynomial, generates an estimated CRC syndrome based on the reverse CRC generation polynomial, and generates the uncorrectable error signal if the estimated CRC syndrome is not equal to the generated CRC syndrome.

Other aspects and advantages of the present invention can be seen by a study of the figures, detailed description and claims below.

DETAILED DESCRIPTION

The present invention is described with reference to FIGS. 1, 2 and 3.

Figure 1:
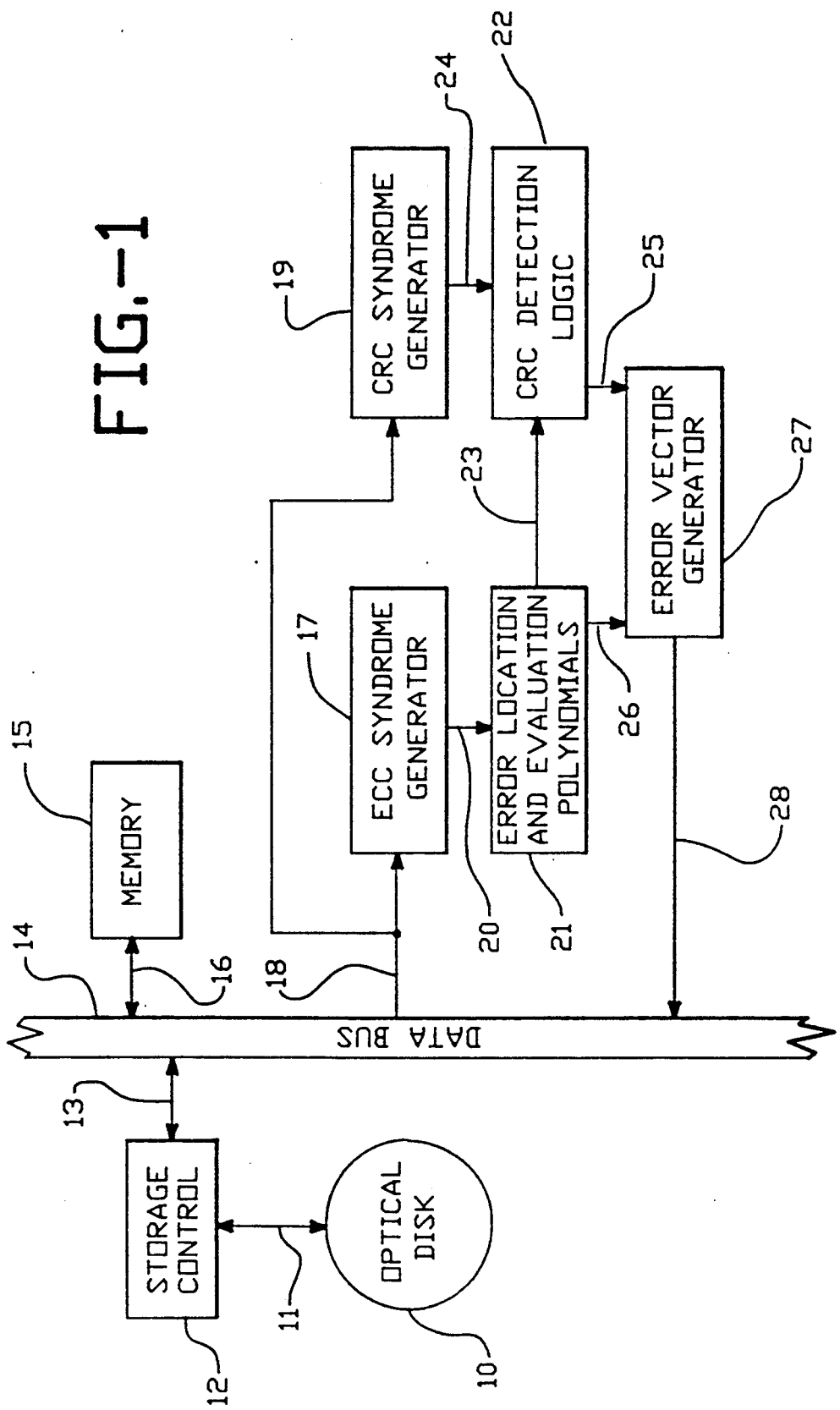
FIG. 1 is a block diagram of a data storage system implementing the present invention.

FIG. 1 is a block diagram of a data storage system implementing the present invention. The data storage system includes an optical disk storage media 10 coupled across line 11 to a storage control 12. Storage control 12 is coupled across line 13 to data bus 14. A memory 15 is coupled to the data bus across line 16. As data is read from the optical disk 10 through storage control 12 into memory 15, the data is written into an ECC syndrome generator 17 and into a CRC syndrome generator 19 across line 18. The ECC syndrome is generated and, if non-zero, supplied across line 20 to logic generating an error polynomial 21. If the ECC syndrome is zero, a control signal indicating the same is supplied on line 20. The terms of the error polynomial, or the control signal indicating no errors detected, are supplied across line 23 to CRC detection logic 22, and a CRC syndrome generated by the CRC syndrome generator 19 is supplied across line 24 to the CRC detection logic 22. As the terms of the error polynomial become available, the CRC detection logic 22 generates an estimated CRC syndrome and compares it with the syndrome generated in the CRC generator 19. If the control signal is asserted, indicating no detected errors in the ECC logic, the estimated CRC syndrome is zero.

If the estimated CRC syndrome and the generated CRC syndrome are equal, then all errors are corrected, otherwise an uncorrectable error signal is generated on line 25 by the CRC detection logic 22.

The error location and evaluation polynomials are supplied on line 26 to an error vector generator 27. The error vector generator 27 is also coupled to receive the uncorrectable error signal on line 25. An error vector is then supplied on line 28 to the data bus 14. The error vector can then be utilized in the system to correct the data stored in the memory 15, if no uncorrectable errors were detected.

Figure 2:
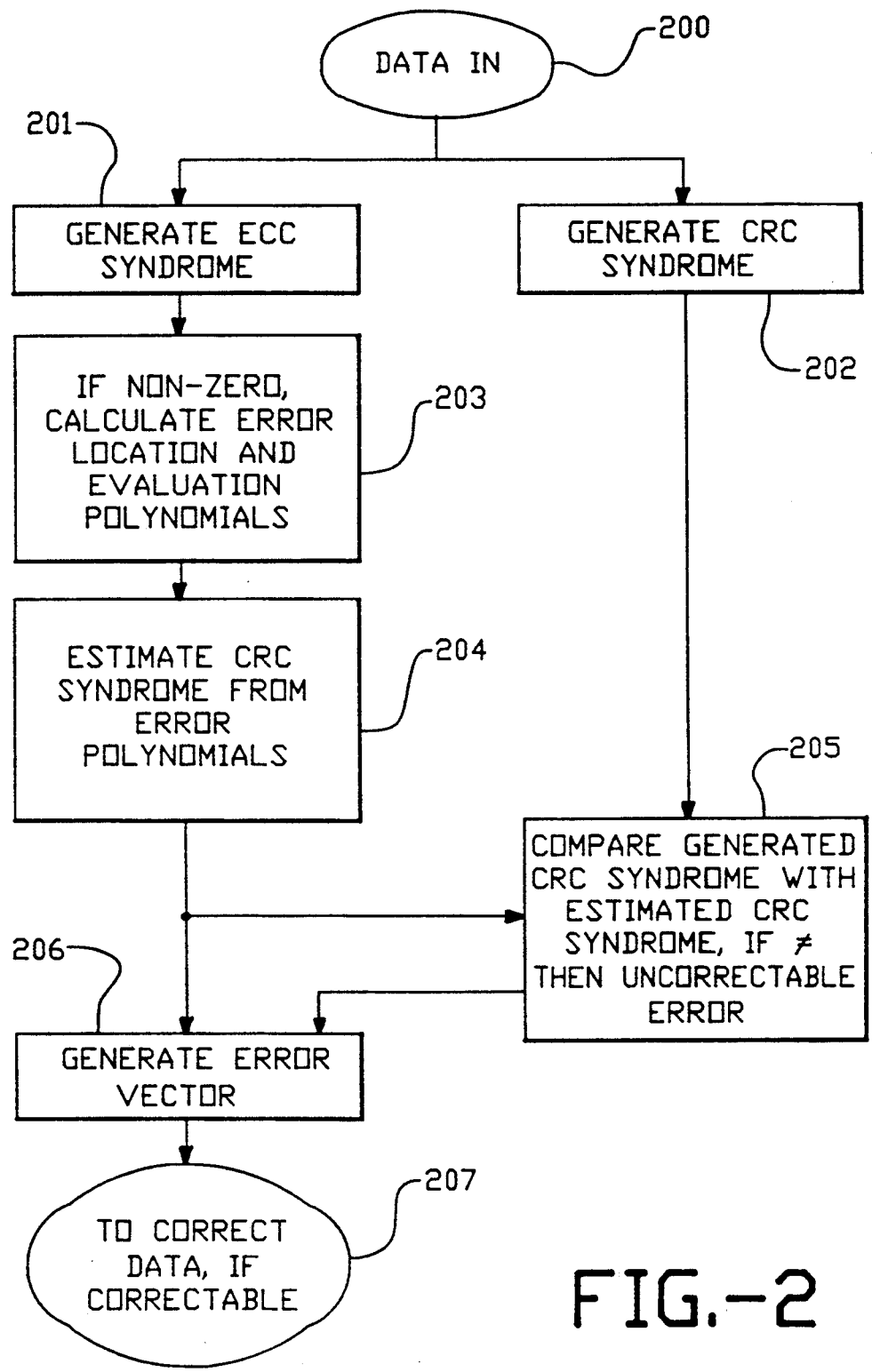
FIG. 2 is a flow chart illustrating a method according to the present invention.

FIG. 2 is a flow chart of the method of operation of the system according to the present invention for detecting uncorrectable errors in a sector of data.

First, the data is read across the bus (block 200). The data on the bus is supplied to ECC syndrome generator and the CRC syndrome generator where the ECC syndrome is generated (block 201) and the CRC syndrome is generated (block 202).

If the ECC syndrome is non-zero, then error location and evaluation polynomials are calculated (block 203). From the error evaluation and location polynomials, an estimated CRC syndrome is calculated (block 204). The CRC syndrome generated in block 202 is compared with the CRC syndrome estimated in block 204, and if they are unequal then an uncorrectable error signal is generated (block 205). An error vector is generated in response to the error evaluation and location polynomials and the uncorrectable error signal (block 206). The error vector is then supplied to the system for correction of the data if correctable (block 207).

Euclid Divide and Polynomial Multiply modules compute the error evaluation and error location polynomials from the generated ECC syndrome polynomial S(x).

| Euclid Divide | Polynomial Multiply |
|---|---|
| 0. | Initial Value of $\Lambda$ Polynomial $\Lambda_0(x) = 1, \Lambda_{-1}(x) = 0$ |
| 1. $\frac{x^{16}}{S(x)} = q_1(x) + \frac{r_1(x)}{S(x)}$ | $\Lambda_1(x) = q_1(x)*\Lambda_0(x) + \Lambda_{-1}(x)$ |
| 2. $\frac{S(x)}{r_1(x)} = q_2(x) + \frac{r_2(x)}{r_1(x)}$ | $\Lambda_2(x) = q_2(x)*\Lambda_1(x) + \Lambda_0(x)$ |
| . | . |
| . | . |
| . | . |
| i. $\frac{r_{i-2}(x)}{r_{i-1}(x)} = q_i(x) + \frac{r_i(x)}{r_{i-1}(x)}$ | $\Lambda_i(x) = q_i(x)*\Lambda_{i-1}(x) + \Lambda_{i-2}(x)$ |

Repeat until the degree of $r_i(x)$ is less than 8.

$r_i(x) = \Omega(x) =$ Error Evaluation polynomial
$\Lambda_i(x) =$ Error Location polynomial The degree of $\Lambda_i(x)$ indicates the expected number of errors in the interleave. The next step determines if all errors can be found or an uncorrectable error is present.

The Chien Search logic evaluates the Error Location Polynomial $\Lambda_i(x)$ at $\alpha^{255}, \ldots, \alpha^{255-k}$, where k is the code length of the interleave. An error is assumed present at offset j if $\Lambda_i(\alpha^{255-j}) = 0$. Logic counts the number of roots (zeroes) of $\Lambda_i(x)$ that are found (say n).

If n equals the degree of $\Lambda_i(x)$ then all errors have been found, and the value of the errors is obtained as explained below. If n does not equal the degree of $\Lambda_i(x)$ then an uncorrectable error is assumed to be present.

For each iteration of the Chien Search logic, Error Evaluator/Polynomial Derivative logic computes an error value:

$$E_j = \frac{\Omega_i(\alpha^{255-j})}{\Lambda'_i(\alpha^{255-j})}$$

where $\Lambda'_i(\alpha^{255-j})$ is the derivative of the Error Location Polynomial. $E_j$ is the error value for the byte at offset j when $\Lambda_i(\alpha^{255-j}) = 0$. Terms j of the error polynomial are then defined as $e(x) = E_j x^j$. Each term $E_j$ can be combined with data location $x^j$ to correct detected errors.

The estimated CRC syndrome is generated based on terms of the error polynomial e(x).

The Chien Search implements a searching algorithm for roots of the error polynomial from the highest order to the lowest order with respect to the location of data within the sector. This gives you the lowest order j terms of the error polynomial first and is referred to as a forward Chien Search.

The CRC syndrome is generated from the high to low orders with respect to the data in the sector. Therefore, all terms of the error polynomial must be generated before calculation of the estimated CRC syndrome may complete.

The estimated CRC syndrome may be generated as the terms of the error polynomial are generated if a backward Chien Search is utilized. In this embodiment, each term of the error polynomial as generated is supplied to the CRC detection logic and operated upon. When the last term of the error polynomial is supplied to the CRC detection logic, the estimated CRC syndrome is supplied. This allows for implementation of the CRC detection logic with less memory, since all terms of the error polynomial need not be stored for generation of the estimated CRC syndrome. In addition, the estimated CRC syndrome will be available more quickly because less processing is required after receipt of the last term of the error polynomial.

It is preferable to use a forward Chien Search because of convenience of implementation for the variable code lengths possible. Using a backward Chien Search, the length of the interleave must be found by logic before proceeding with the reverse search. This logic for finding the length of the interleave and variable length interleaves complicates implementation of the error detection and correction system. A forward Chien Search, on the other hand, always begins at the lowest order of the error polynomial.

However, since the order of the error locations coming out of a forward Chien Search block is reversed, a preferred embodiment of the present invention uses a reverse CRC generation polynomial to operate on the error polynomial terms as they proceed from lowest order to highest order.

If e(x) is an error polynomial, $$e(x) = e_0 + e_1 x + e_2 x^2 + \ldots + e_{n-2} x^{n-2} + e_{n-1} x^{n-1}$$

where $e_i$ can be 0 for $i = 0, 1, \ldots, n-1$.

Then with a forward Chien Search, the order of the coefficients generated goes from $e_0$ to $e_{n-1}$. And with a backward Chien Search $e_{n-1}$ comes first and $e_0$ comes last.

The following proof demonstrates that the CRC syndrome polynomial s(x) can be calculated from the error value polynomial and the CRC generation polynomial.

| | | |
|---|---|---|
| Let | $i(x)$ | = information polynomial, |
| | $g(x)$ | = CRC generation polynomial, |
| | $c(x)$ | = codeword polynomial, |
| | $e(x)$ | = error polynomial, |
| | $r(x)$ | = received codeword polynomial, |
| and | $s(x)$ | = CRC syndrome polynomial |
| | | with deg $[g(x)]$ = r. |
| Then | $c(x)$ | = $i(x) \cdot x^r + [i(x) \cdot x^r] \bmod g(x)$, |
| | $r(x)$ | = $c(x) + e(x)$, |
| and | $s(x)$ | = $r(x) \bmod g(x)$. |
| Then | $s(x)$ | = $r(x) \bmod g(x)$ |
| | | = $[c(x) + e(x)] \bmod g(x)$ |
| | | = $c(x) \bmod g(x) + e(x) \bmod g(x)$. |
| | | = $e(x) \bmod g(x)$ |

So if error estimation is correct, then $s(x) = r(x) \bmod g(x)$ from CRC syndrome generation block should be the same as $e(x) \bmod g(x)$ using estimated errors from error value and location generation unit.

If not, uncorrectable errors occurred.

The following proof demonstrates that the reciprocal of the CRC syndrome can be generated from the results of a forward Chien Search and a reverse CRC generation polynomial.

| | |
|---|---|
| Forward Chien Search: | $e_0, e_1, e_2, \ldots, e_{n-2}, e_{n-1}$ in availability order |
| Backward Chien Search: | $e_{n-1}, e_{n-2}, \ldots, e_2, e_1, e_0$ in order of availability |

Let n be the code length.
With $e(x) = e_{n-1}x^{n-1} + e_{n-2}x^{n-2} + \ldots + e_1x + e_0$
where $e_i$ can be 0, i=0, 1, ..., n−1,
Let $e_R(x) = e_0x^{n-1} e_1x^{n-2} + \ldots + e_{n-2}x + e_{n-1}$.
With $g(x) = x^r + g_{r-1}x^{r-1} + \ldots + g_1x + g_0$,
$g_R(x) = g_0x^r + g_1x^{r-1} + \ldots + g_{r-1}x + 1 = g_0 g_{RN}(x)$.
With $s(x) = s_{r-1}x^{r-1} + s_{r-2}x^{r-2} + \ldots + s_1x + s_0$,
$s_R(x) = s_0x^{r-1} + s_1x^{r-2} + \ldots + s_{r-2}x + s_{r-1}$.
Then from $s(x) = e(x) \bmod g(x)$ $$e(x) = q(x) g(x) + s(x)$$
$$\to e_R(x) = x^{n-1} e(x^{-1})$$
$$= x^{n-1}(q(x^{-1}) \cdot g(x^{-1}) + s(x^{-1}))$$
$$= q_R(x) \cdot g_R(x) + x^{n-1}s(x^{-1})$$
$$= q_R(x) \cdot g_R(x) + x^{n-r}s_R(x)$$
$$=> x^r e_R(x) \bmod g_{RN}(x) = -s_R(x) = s_R(x)$$

For a standard X3B11 implementation, the reverse CRC generation polynomial is calculated as follows.

$$g(x) = \prod_{i=136}^{139} (x + \alpha^i) = x^4 + \alpha^{97}x^3 + \alpha^{117}x + \alpha^{40}$$

$$=> g_R(x) = \alpha^{40}x^4 + \alpha^{117}x^3 + \alpha^{228}x^2 + \alpha^{97}x + 1,$$
$$= \alpha^{40}(x^4 + \alpha^{77}x^3 + \alpha^{188}x^2 + \alpha^{57}x + \alpha^{215}).$$

$\alpha = \alpha^{40} g_{RN}(x)$

Then $$s_R(x) = x^4 \cdot e_R(x) \bmod g_{RN}(x),$$
$$= x^4 e_R(x) \bmod [x^4 + \alpha^{77}x^3 + \alpha^{188}x^2 + \alpha^{57}x + \alpha^{215}].$$

Figure 3:
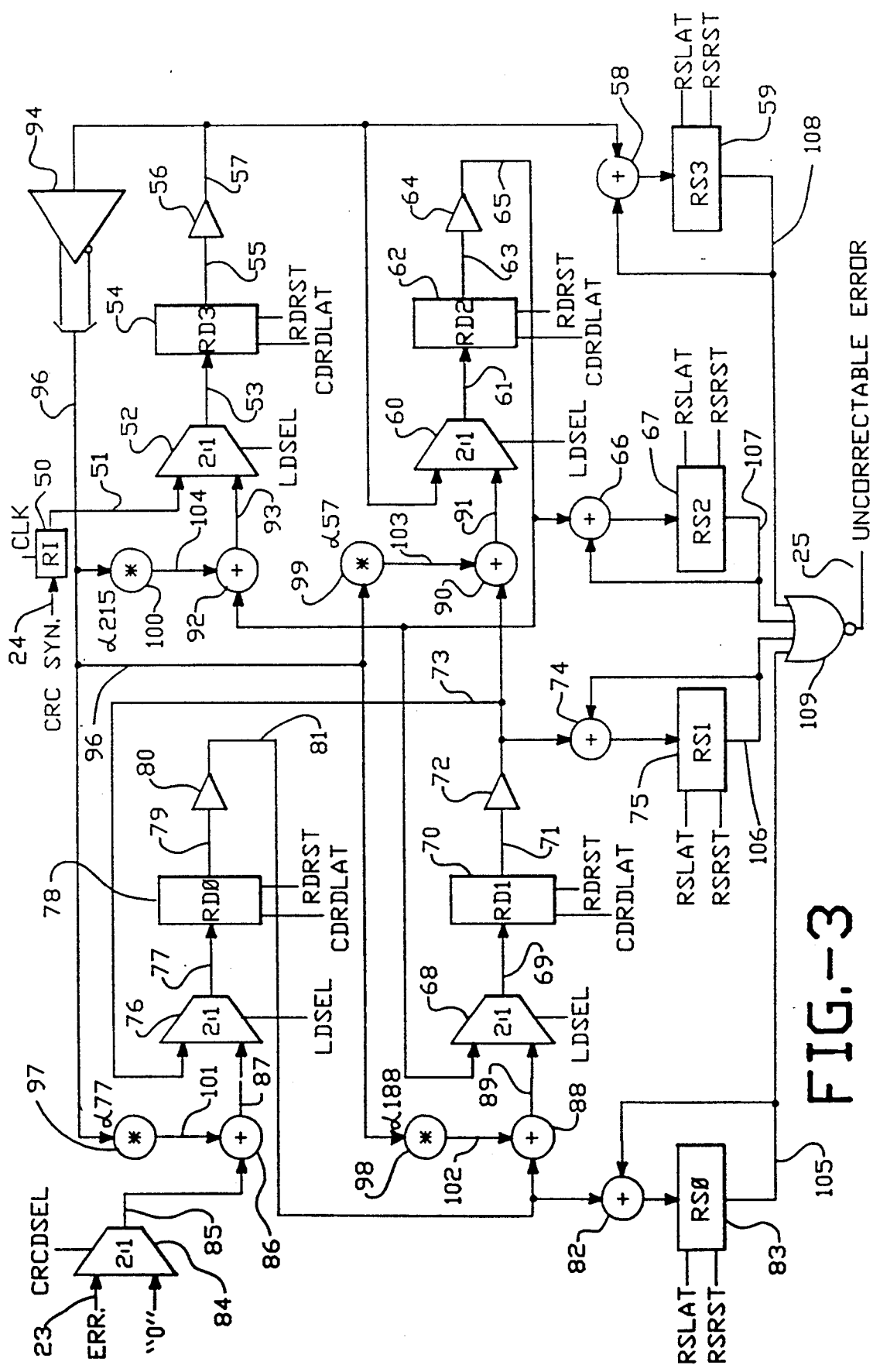
FIG. 3 is a diagram of the CRC detection logic utilized in a preferred embodiment of the present invention.

FIG. 3 illustrates an implementation of the CRC detection block for the reverse CRC syndrome $S_R(x)$ according to the preferred embodiment of the present invention.

The CRC detection logic as shown in FIG. 3 is connected to receive the error polynomial terms as generated across line 23 and the CRC syndrome terms as generated across line 24. The CRC syndrome terms on line 24 are supplied first. They are latched in register RI 50 and supplied across line 51 into 2:1 multiplexer 52. During loading of the CRC syndrome terms, the control signal LDSEL is asserted to select the signal on line 51 as the output of multiplexer 52 on line 53. The term is latched in register RD3 54 in response to the CDRDLAT control signal, and supplied on line 55 through buffer 56 to line 57.

The first term supplied across line 24 is the high order coefficient S3 of the generated CRC syndrome. This term is supplied through adder 58 into register RS3 59 in response to the RSLAT control signal.

The second term of the CRC syndrome is supplied through register RD3 54 onto line 57 as a first input to multiplexer 60. The LDSEL is signal asserted to select the second term of the CRC syndrome as the output of multiplexer 60 across line 61 to latch RD2 62. The latch RD2 62 accepts the second term in response to the CDRDLAT signal, and supplies it on line 63 through buffer 64 to line 65. The second term is supplied through adder 66 to latch RS2 67 in response to the RSLAT control signal.

The third term of the CRC syndrome supplied across line 24 is latched through RD3 and RD2 onto line 65 as an input to 2:1 multiplexer 68. The LDSEL signal is asserted to select the third term across line 69 as an input to latch RD1 70. In response to a third assertion of CDRDLAT, the third term is latched in RD1 70 and supplied across line 71 through buffer 72 onto line 73. The third term is supplied through adder 74 to latch RS1 75 in response to assertion of the RSLAT signal.

The fourth term of the CRC syndrome 24 is supplied through RI 50, RD3 54, RD2 62, RD1 70 onto line 73 as an input to 2:1 multiplexer 76. The LDSEL signal selects the fourth term as the output of multiplexer 76 on line 77 which is connected to the input of latch RD0 78. Latch RD0 stores the fourth term in response to the CDRDLAT signal and supplies it on line 79 through buffer 80 to line 81 The fourth term is supplied through adder 82 to latch RS0 83 in response to the RSLAT signal. In this manner, the four terms of the CRC syndrome are latched in reverse order in registers RS0 through RS3, to implement a reverse CRC syndrome.

After loading of the CRC syndrome, the error polynomial is supplied through 2:1 multiplexer 84 to line 85, if the CRCDSEL control signal is not asserted. The CRCDSEL control signal is asserted to select all zeros through 2:1 multiplexer 84 if the ECC syndrome is zero and no error polynomial is generated.

First, registers RD0 through RD3 are reset in response to the RDRST signal. The first term of the error polynomial is selected across line 85 through adder 86 and on line 87 as a second input to 2:1 multiplexer 76. The LDSEL signal results in selection of the error term through the multiplexer 76 to line 77 and into RD0 78. The second term of the error polynomial is supplied across line 85 through adder 86 into RD0 while the first term is supplied on line 81 through adder 88, multiplexer 68, and line 69 into register RD1 70. The third term of the error polynomial is selected through adder 86 and multiplexer 76 into RD0 78 while the second term is shifted through adder 88, multiplexer 68 into latch RD1 and the first term is shifted along line 71 through buffer 72, line 73, adder 90, line 91, multiplexer 60, and line 61 into latch RD2 62. Finally, the fourth term of the error polynomial is shifted into RD0 while the third, second and first terms are shifted through the detection logic as before, with the first term being shifted along line 65 through adder 92, line 93, multiplexer 52, and line 53 into RD3 54. The value in RD3 54 is supplied on line 55 through buffer 56 onto line 57 where it is supplied as input to true and complement generator 94. True and complement outputs 96 of the signal generated by true and complement generator 94 are supplied as inputs to multipliers 97, 98, 99, and 100, which require the true and complement inputs to perform multiplication.

Multiplier 97 multiplies the signal on line 96 by $\alpha^{77}$ and supplies its output on line 101 as a second input to adder 86. Likewise, the signal on line 96 is multiplied in multiplier 98 by $\alpha^{188}$ and supplied on line 102 as a second input to adder 88. The signal on line 96 is supplied through multiplier 99 where it is multiplied by $\alpha^{57}$ and supplied on line 103 as a second input to adder 90. Multiplier 100 multiplies a signal on line 96 by $\alpha^{215}$ and supplies its output on line 104 as a second output to adder 92.

As the terms of the error polynomial are generated, they are successively latched through the CRC detection circuit of FIG. 3 in response to the CDRDLAT signal until all terms have been received. The $x^4$ term of $S_R(x)$ can be implemented by shifting four zero terms at the end of the error polynomial into the detection logic of FIG. 3. In an implemented system, the $x^4$ term is cancelled by shifting four zeros at the end of the data polynomial used into the logic generating CRC syndrome. The effect is the same.

When all terms have been received, the RSLAT signal is asserted so that the value in RD0 is summed with the value in RS0 and stored in latch RS0. The value in RD1 is summed with the value in RS1 and stored in RS1. The value in RD2 is summed with the value in RS2 and latched in RS2. Finally, the value in RD3 is summed with the value in RS3 and latched into RS3.

For a single interleave sector, the output of RS0 through RS3 on lines 105 through 108 represent a comparison of the estimated CRC syndrome with the generated CRC syndrome.

The lines 105 through 108 are connected as inputs to NOR gate 109. The output of NOR gate 109 is the uncorrectable error signal on line 25. If any of the signals on line 105 through 108 are non-zero, then the uncorrectable error signal will be asserted active low.

For a sector involving a plurality of interleaves, each interleave value is latched into the registers RS0 through RS3 while being scanned with the result of previous interleaves. On receipt of the final term of the final interleave, the uncorrectable error signal is sampled.

After performance of the CRC detection using the circuit of FIG. 3, the RSRST signal is asserted to clear the latches RS0 through RS3 in order to initialize the circuit for operation on a following sector.

As can be seen, this CRC detection logic of FIG. 3 implements the reverse CRC generation polynomial, and calculates an estimated CRC syndrome. The estimated CRC syndrome is compared with the CRC syndrome supplied across line 24 and previously stored in the registers RS0 through RS3. Result of the comparison is supplied on line 25 as the uncorrectable error signal.

Equivalent circuits could be implemented in which the CRC syndrome on line 24 is stored in latches separate from RS0 through RS3. The outputs of such latches could be compared using XOR gates or other comparators as known in the art without requiring loading of the RS0 through RS3 latches with the generated CRC syndrome from line 24.

The CRC detection logic illustrated in FIG. 3 allows generation of the estimated CRC syndrome in parallel with the generation of the error polynomial. In addition, the uncorrectable error signal can be generated based on a single read of the sector of data, providing a significant performance advantage over prior art error detection and correction systems based on a first code for detecting and correcting errors and a second code for determining whether uncorrectable errors exist in the sector.

The representative error detection and correction system for which the present invention is suited is the X3B11 standard for optical storage media on 5¼ inch disks. Such standard is incorporated by reference in the present application as if fully set forth herein.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

We claim:

1. In a data storage system storing sectors of data in a store, each sector including a data block, an error checking and correcting (ECC) block, and an error detecting (ED) block, an apparatus for signalling the occurrence of uncorrectable errors in a sector, the apparatus comprising:

a data bus, connected to the store, for communication of the sector;

first means, connected to the data bus and responsive to the ECC block in the sector, for generating an error polynomial identifying location and value for correctable errors in the sector;

second means, connected to the data bus and responsive to the ED block in the sector, for generating a syndrome identifying detected errors in the data block; and evaluation means, coupled to the first means and the second means and responsive to the error polynomial and the syndrome, for generating an uncorrectable error signal if the detected errors do not match the correctable errors;

wherein the first means includes means for performing a forward Chien Search over the sector so that the error polynomial has an order with respect to bytes of data within the data block, and wherein the syndrome is generated in a reverse order with respect to the order.

2. In a data storage system storing sectors of data in a store, each sector including a data block, an error checking and correcting (ECC) block, and an error detecting (ED) block, an apparatus for signalling the occurrence of uncorrectable errors in a sector, the apparatus comprising:
- a data bus, connected to the store, for communication of the sector;
- first means, connected to the data bus and responsive to the ECC block in the sector, for generating an error polynomial identifying location and value for correctable errors in the sector, wherein the error polynomial has a plurality of terms, and the first means generates the plurality of terms of the error polynomial from low order to high order with respect to bytes of data in the data block;
- second means, connected to the data bus and responsive to the ED block in the sector, for generating a syndrome identifying detected errors in the data block, wherein the syndrome is a second polynomial with a plurality of terms, and the second means generates the plurality of terms in the second polynomial from high order to low order based on a CRC generation polynomial with a plurality of terms; and
- evaluation means, coupled to the first means and the second means and responsive to the error polynomial and the syndrome, for generating an uncorrectable error signal if the detected errors do not match the correctable errors.

3. The apparatus of claim 2, wherein:
the first means includes means for performing a backward Chien Search over the sector.

4. The apparatus of claim 2, wherein:
the ECC block is a first Reed-Solomon polynomial; and
the ED block is a second Reed-Solomon polynomial.

5. The apparatus of claim 4, wherein:
the first Reed-Solomon polynomial and the second Reed-Solomon polynomial are specified by international standard X3B11 for 5¼ inch optical storage media.

6. The apparatus of claim 2, wherein the evaluation means includes:
- means for reversing the second polynomial to generate a reverse second polynomial having a plurality of terms from low order to high order; and
- detection means, coupled with the means for reversing and receiving the plurality of terms of the error polynomial as generated and responsive to the reverse second polynomial, for generating the uncorrectable error signal.

7. The apparatus of claim 6, wherein:
the plurality of terms of the error polynomial includes a final term that is received last by the detection means; and
the detection means generates the uncorrectable error signal in response to receiving the final term.

8. The apparatus of claim 6, wherein the detection means includes:
- means for combining the error polynomial with a reverse CRC generation polynomial to generate an estimated reverse second polynomial; and
- means, connected to the means for combining and the means for reversing, for comparing the reverse second polynomial with the estimated reverse second polynomial to indicate the occurrence of uncorrectable errors.

9. The apparatus of claim 8, wherein:
the plurality of terms of the error polynomial includes a final term that is received last by the detection means; and
the detection means generates the uncorrectable error signal in response to receiving the final term.

10. In a data storage system storing sectors of data in a store, each sector including a data block, an error checking and correcting (ECC) block, and an error detecting (ED) block, a method for signalling the occurrence of uncorrectable errors in a sector, the method comprising the steps of:
- communicating the sector across a data bus;
- generating, in error detecting and correcting logic in response to the sector on the data bus, an error polynomial including a plurality of terms, the error polynomial identifying location and value for correctable errors in the sector;
- generating, in error detecting logic in response to the sector on the data bus, a syndrome identifying detected errors in the data block, and storing the syndrome; and
- generating, in combining logic in response to the error polynomial and the syndrome, an uncorrectable error signal if the detected errors do not match the correctable errors;
- wherein the step of generating an error polynomial includes performing a forward Chien Search over the sector so that the error vector has an order with respect to bytes of data within the data block, and wherein the syndrome is generated in a reverse order with respect to the order.

11. In a data storage system storing sectors of data in a store, each sector including a data block, an error checking and correcting (ECC) block, and an error detecting (ED) block, a method for signalling the occurrence of uncorrectable errors in a sector, the method comprising the steps of:
- communicating the sector across a data bus;
- generating, in error detecting and correcting logic in response to the sector on the data bus, an error polynomial including a plurality of terms, the error polynomial identifying location and value for correctable errors in the sector, the plurality of terms of the error polynomial being generated from low order to high order with respect to bytes of data in the data block;
- generating, in error detecting logic in response to the sector on the data bus, a syndrome identifying detected errors in the data block, and storing the syndrome, the syndrome being a second polynomial with a plurality of terms, the plurality of terms in the second polynomial being generated from high order to low order based on a CRC generation polynomial with a plurality of terms; and
- generating, in combining logic in response to the error polynomial and the syndrome, an uncorrectable error signal if the detected errors do not match the correctable errors.

12. The method of claim 11, wherein:
the step of generating an error polynomial includes performing a backward Chien Search over the sector.

13. The method of claim 11, wherein: the ECC block is a first Reed-Solomon polynomial and the ED block is a second Reed-Solomon polynomial.

14. The method of claim 13, wherein:
the first Reed-Solomon polynomial and the second Reed-Solomon polynomial are specified by international standard X3B11 for 5¼ inch optical storage media.

15. The method of claim 11, wherein the step of generating an uncorrectable error signal includes:
   reversing the second polynomial to implement a reverse second polynomial having a plurality of terms from low order to high order; and
   generating the uncorrectable error signal in response to the plurality of terms of the error polynomial and to the reverse second polynomial.

16. The method of claim 15, wherein:
   the plurality of terms of the error polynomial includes a final term; and
   the step of generating the uncorrectable error signal generates the uncorrectable error signal upon receipt of the final term.

17. The method of claim 15, wherein the step of generating the uncorrectable error signal includes:
   combining the error polynomial with a reverse CRC generation polynomial to generate an estimated reverse second polynomial; and
   comparing the reverse second polynomial with the estimated reverse second polynomial to indicate the occurrence of uncorrectable errors.

18. The method of claim 17, wherein:
   the plurality of terms of the error polynomial includes a final term that is received last; and
   the uncorrectable error signal is generated upon receipt of the final term.

19. In a data storage system storing sectors of data in a store, each sector including a data block, an error checking and correcting (ECC) block, and an error detecting (ED) block, an apparatus for signalling the occurrence of uncorrectable errors in a sector, the apparatus comprising:
   a data bus, connected to the store, for communication of the sector;
   first means, connected to the data bus and responsive to the ECC block in the sector, for generating an error polynomial identifying location and value for correctable errors in the sector, wherein the error polynomial has a plurality of terms generated from low order to high order with respect to bytes of data in the data block;
   second means, connected to the data bus and responsive to the ED block in the sector, for generating a syndrome identifying detected errors in the data block, wherein the syndrome is a second polynomial with a plurality of terms generated from high order to low order based on a CRC generation polynomial with a plurality of terms;
   means for reversing the second polynomial to implement a reverse second polynomial having a plurality of terms from low order to high order; and
   detection means, coupled with the means for reversing, and receiving the plurality of terms of the error polynomial as generated and responsive to the reverse second polynomial, for generating an uncorrectable error signal if the detected errors do not match the correctable errors.

20. The apparatus of claim 19, wherein:
   the plurality of terms of the error polynomial includes a final term that is received last by the detection means; and
   the detection means generates the uncorrectable error signal in response to receiving the final term.

21. The apparatus of claim 19, wherein the detection means includes:
   means for combining the error polynomial with a reverse CRC generation polynomial to generate an estimated reverse second polynomial; and
   means, connected to the means for combining and the means for reversing, for comparing the reverse second polynomial with the estimated reverse second polynomial to indicate the occurrence of uncorrectable errors.

22. The apparatus of claim 19, wherein:
   the first means includes means for performing a forward Chien Search over the sector.

23. The apparatus of claim 19, wherein:
   the first means includes means for performing a backward Chien Search over the sector.

24. The apparatus of claim 19, wherein: the ECC block is a first Reed-Solomon polynomial; and the ED block is a second Reed-Solomon polynomial.

25. The apparatus of claim 24, wherein:
   the first Reed-Solomon polynomial and the second Reed-Solomon polynomial are specified by international standard X3B11 for 5¼ inch optical storage media.

* * * * *